United States Patent [19]
Holczer et al.

[11] Patent Number: 5,512,829
[45] Date of Patent: Apr. 30, 1996

[54] METHOD OF MEASURING PULSED ELECTRON SPIN RESONANCE SIGNALS AND PULSED ELECTRON SPIN RESONANCE SPECTROMETER

[75] Inventors: Károly Holczer, Los Angeles, Calif.; Dieter Schmalbein, Marxzell-Burbach; Peter Höfer, Karlsruhe, both of Germany

[73] Assignee: Bruker Analytical Mebtechnik GmbH, Rheinstetten-Forcheim, Germany

[21] Appl. No.: 310,938

[22] Filed: Sep. 22, 1994

[30] Foreign Application Priority Data

Apr. 11, 1994 [DE] Germany ............... 44 12 064.8

[51] Int. Cl.$^6$ ........................................... G01V 3/00
[52] U.S. Cl. ............... 324/316; 324/318; 324/322
[58] Field of Search ...................... 324/300, 316, 324/318, 322

[56] References Cited

U.S. PATENT DOCUMENTS 4,812,763  3/1989  Schmalbein ............... 324/316

OTHER PUBLICATIONS

"High–Frequency Pulsed Electron Spin Resonance", Allgeier et al. *Modern Pulsed & Continuous–Wave Electron Spin Resonance*, pp. 267–283.

"Electron Spin Echo Spectroscopy at 95 GHZ", Weber et al. *Pulsed EPR:A New Field of Applications*, 1989, pp. 186–190.

"Pulsed EPR in 2–mm Band", Bresgunov, et al., *Applied Magnetic Resonance*, 1991, pp. 715–728.

*Primary Examiner*—Sandra L. O'Shea
*Assistant Examiner*—Mack Haynes
*Attorney, Agent, or Firm*—Feix & Feix

[57] ABSTRACT

A pulsed electron spin resonance spectrometer is provided with a first microwave oscillator for generating measuring signals of a high microwave frequency of about 80 GHz or above. A second microwave oscillator generates auxiliary signals at a lower microwave frequency of about 12 GHz or below. A first mixer generates mixed signals by mixing a measuring signal with an auxiliary signal. A pulse shaping channel generates pulsed mixed signals having a pulse length sufficient for carrying out pulsed electron spin resonance experiments. Moreover, a measuring resonator is provided to which the pulsed mixed signals are applied. A second mixer generates an output signals of a lower microwave frequency by mixing the mixed signal outputted from the measuring resonator with a signal being derived from the first microwave oscillator. A pulse shaping channel is switched between the second microwave oscillator and the first mixer.

18 Claims, 2 Drawing Sheets

METHOD OF MEASURING PULSED ELECTRON SPIN RESONANCE SIGNALS AND PULSED ELECTRON SPIN RESONANCE SPECTROMETER

BACKGROUND OF THE INVENTION

1. Field of the Invention

The present invention relates generally to electron spin resonance spectrometry, and, more particularly, to pulsed electron spin resonance spectrometry at high microwave frequencies in excess of 80 GHz.

2. Description of Related Art

It is generally known to carry out pulsed electron spin resonance experiments at high microwave frequencies cf. "High-Frequency Pulsed Electron Spin Resonance" by J. Allgeier et al., in L. Kevan et al. (Ed.) "MODERN PULSED AND CONTINUOUS-WAVE ELECTRON SPIN RESONANCE", John Wiley & Sons, New York, 1989, pp. 267 to 283; "ELECTRON SPIN ECHO SPECTROSCOPY AT 95 GHZ" by R. T. Weber et al., in C. P. Keijzers et al. (Ed.) "Pulsed EPR: A new field of applications", North Holland Publishers, Amsterdam, 1989, pp. 186 to 190.

Electron spin resonance spectroscopy is an analytical measurement technology having been known since about 50 years and having been well-established in physics, chemistry and biochemistry. Although electron spin resonance and nuclear magnetic resonance are based on the same elementary physical phenomena, the development in the respective spectrometer technology has taken a very different course in the two fields.

For example, the gyromagnetic ratio of electrons is about a factor of 1000 higher than that of nuclei (protons). Therefore, classical apparatuses for electron spin resonance spectrometry work at a field strength of 0.3 Tesla and a measuring frequency at X-band (e.g. 9.6 GHz), whereas nuclear magnetic resonance experiments have been carried out at fields of 1.4 Tesla field strength and at measuring frequencies of 100 MHz. The frequency ranges and magnetic field strength ranges were, therefore, distinct from each other by about one order of magnitude.

Due to the development of superconducting magnets the measuring frequencies have been shifted upwardly in the two fields. Therefore, nuclear magnetic resonance experiments are today carried out at measuring frequencies of up to 750 MHz, the magnetic field strength being in the order of 10 Tesla.

In electron spin resonance spectroscopy, too, measurements have been carried out at substantially higher measuring frequencies as mentioned above, e.g. at 95 GHz or even at 140 GHz; "A. Yu. Bresgunov Pulsed EPR in 2-mm Band", Applied Magnetic Resonance 2, pp. 715 to 728 (1991).

Electron spin resonance experiments have been carried out until about 10 years ago exclusively as continuous wave experiments. However, since that time the technology of pulsed electron spin resonance has also been developed. A typical electron spin resonance spectrometer for pulsed experiments is, for example, disclosed in U.S. patent specification 4,812,763 (Schmalbein).

In conventional pulsed electron spin resonance experiments using a field of, for example, 0.35 Tesla field strength microwave pulses having a pulse length of 10 ns at a microwave power of 1 kW are required for achieving the flip angle of electron spins. The necessary resolution during receiving the pulsed signals is in the order of $10^{-9}$ sec. Under these conditions the information that may be expected to be provided by the experiment, in particular the resolution, is in the order of nuclear magnetic resonance measurements with a measuring frequency of 14 MHz, related to protons ($^1$H).

As may be taken from the aforementioned considerations, the technology of pulsed electron spin resonance spectroscopy was pretty soon limited by the available technology because electronic components, in particular microwave components in the nanosecond range, still more particularly fast switching microwave switches, were hardly available on the non-military market. However, at measuring frequencies at X-band such components are meanwhile also available on the civil market so that the technology of pulsed electron spin resonance spectrometry has in the meanwhile also been established at this measuring frequency.

On the other hand, with all measuring technologies of magnetic resonance one wishes to increase the measuring frequency to the best possible extent because the measuring sensitivity increases with the square of the measuring frequency.

Therefore, as mentioned above, one has already made attempts to shift the measuring frequency of pulsed electron spin resonance experiments into the range of above 100 GHz.

In the scientific literature of Allgeier and Weber, mentioned at the outset, a pulsed electron spin resonance spectrometer of insofar identical design is described as having an effective measuring frequency of 94.9 GHz.

For generating the measuring frequency in this prior art spectrometer a first microwave oscillator is used having a frequency of 91.9 GHz and an output power of 150 mW. The output signal of this first microwave oscillator is mixed in a mixer with the signal of a second microwave oscillator having a much lower frequency of 3 GHz. For technical reasons the output signal from the second microwave oscillator is gated with a gate time of 20 μs. The gated microwave signal of 3 GHz is now mixed in a mixer with the 91.9 GHz signal from the first microwave oscillator. Because of the mixing a sum signal of 94.9 GHz is generated, however, the output power of the mixer is only 4 mW due to the overall losses in the various components. Therefore, the 94.9 GHz signal is fed into an injection-lock-amplifier for raising the signal level again up to 210 mW.

In order to generate the very narrow and highly dynamic pulses in the nanosecond range as required for pulsed experiments, the prior art spectrometer uses a series arrangement of 3 PIN-diodes being controlled from a central computer by means of separate drive units. The PIN-diodes, therefore, are switched in the circuit path where the microwave signal of high frequency (94.9 GHz) has a high power (210 mW).

The pulsed microwave signal so generated is then fed, as known per se, to the measuring resonator via a circulator. The reflected signal from the resonator, emanating from the circulator is then fed to a further mixer having the original output signal of the first microwave oscillator of 91.9 GHz applied to its second input such that a mixed output signal of again 3 GHz is generated. The 3 GHz signal is then mixed in a subsequent mixer with a 3 GHz signal from the second microwave oscillator.

The prior art spectrometer has several drawbacks. The main drawback is that PIN-diodes having an operating frequency of about 95 GHz are not yet available as standard components and, therefore, are available in the non-military area only at extreme costs. Moreover, such components are extremely sensitive and may even be destroyed if simply touched with the bare hand. Moreover, even if available, such components have a very high input attenuation and a poor isolation. Even if, as discussed with the prior art spectrometer, three PIN-diodes are switched in series, the switching behaviour is not sufficient and the input attenuation may be up to −20 dB. Therefore, with the prior art spectrometer one has attempted to compensate for such high input attenuation by using an injection-lock-amplifier ahead of the diodes. However, due to its concept, an injection-lock-amplifier may only be operated in a pulsed mode with the gated signals as already mentioned. Therefore, additional timing circuitry is necessary for switching the PIN-diodes such that the pulsed nanosecond signals which are needed for the pulsed experiments are correctly placed within the gated microsecond amplifier output signal. However, this is a non-acceptable limitation for pulsed electron spin resonance experiments because it is mandatory to be able in such experiments to place the microwave pulses at arbitrary times for making dead times as small as possible. This holds true in particular when the free induction decay (FID) is being observed when the pulse is still applied.

Finally, the prior art spectrometer has the drawback that even in the lower frequency section a specialized configuration is necessary, not enabling to alternately carry out conventional pulsed or CW experiments at low microwave frequencies without the necessity of entirely reconstructing the spectrometer.

In the other prior art spectrometer as described in the scientific literature of Bresgunov, mentioned before, a microwave measuring signal of 140 GHz is transmitted over a total of four circulators, two of which being provided with PIN-diodes.

Therefore, this prior art spectrometer, too, has the drawback that the switching elements are arranged in the signal path of high frequency.

It is, therefore, an object underlying the present invention to improve a method and a spectrometer such that a measuring frequency in the order of 100 GHz or above may be used although conventional, reliable and easily available components may be used as are already standard for pulsed experiments and which are designed for lower microwave frequencies, typically for X-band.

SUMMARY OF THE INVENTION

In accordance with the invention the claimed method of measuring pulsed electron spin resonance signals comprises the steps of:

generating a first signal of a high microwave frequency of between 20 GHz and 250 GHz;

generating a second signal of a low microwave frequency of between 1 GHz and 20 GHz;

gating said second signal for obtaining a pulsed second signal;

mixing said first signal with said pulsed second signal for generating a pulsed mixed signal having a pulse length sufficient for carrying out pulsed electron spin resonance experiments;

applying said pulsed mixed signal to a measuring resonator containing a sample under investigation;

receiving a measuring signal from said resonator as a response to said application of said pulsed mixed signal;

mixing said measuring signal with an auxiliary signal derived from said first signal for generating an output signal having a lower microwave frequency; and processing said output signal.

In accordance with the invention a pulsed electron spin resonance spectrometer, further, comprises:

first means for generating a first signal of a high microwave frequency of between 20 GHz and 250 GHz;

second means for generating a second signal of a low microwave frequency of between 1 GHz and 20 GHz;

third means for gating said second signal for obtaining a pulsed second signal;

fourth means for mixing said first signal with said pulsed second signal for generating a pulsed mixed signal having a pulse length sufficient for carrying out pulsed electron spin resonance experiments;

fifth means for applying said pulsed mixed signal to a measuring resonator containing a sample under investigation;

sixth means for receiving a measuring signal from said resonator as a response to said application of said pulsed mixed signal;

seventh means for mixing said measuring signal with an auxiliary signal derived from said first signal for generating an output signal having a lower microwave frequency; and eigth means for processing said output signal.

The object underlying the invention is thus entirely achieved.

For, by means of the afore-mentioned measures the pulse shaping is made in the lower microwave frequency channel, for example at X-band. For X-band operation, however, a large variety of components is available being reliable, easy to obtain and little sensitive in operation. Therefore, in contrast to the prior art no artificial tricks are needed for correctly placing the microwave pulses; instead, the pulses may freely be placed in their time sequence and position so that no dead times will occur. It is, therefore, possible to observe the free induction decay (FID) even during the duration of the pulse.

As the signal processing is effected in the range of lower microwave frequencies, all prior art signal processing methods may be used, for example the quadrature detection method. For this reason it is neither necessary to rewrite the spectrometer software because even complex pulse sequences like phase cycling or multi-dimensional experiments may be carried out at high microwave frequencies without necessitating substantial modifications.

The preferred embodiment of this invention relates to a frequency range in the order of 100 GHz. However, it should be understood that the invention is not limited to this frequency range. Instead, applications between 20 and 250 GHz are possible, i.e. up to the transition to infrared radiation.

According to a preferred embodiment of the invention the second signal is adjusted in its phase and amplitude. For that purpose the pulse shaping channel comprises means for adjusting the amplitude and, in particular, the phase.

This measure, being known per se, has the advantage that the pulses may arbitrarily set even at high microwave frequencies, as is the case in conventional spectrometers operating at lower microwave frequencies.

According to another embodiment of the invention the measuring signal emanating from the measuring resonator is mixed with the first signal itself for generating the output signal. For that purpose the first signal itself is applied to the second mixer. This measure has the advantage that the lower microwave frequency is generated at the second mixer output and may then be mixed down a second time with itself for obtaining an output signal.

According to a particularly preferred embodiment of the inventive spectrometer, there are provided a pulse shaping channel, a processing means for processing the output signal and a second measuring resonator operating at the lower microwave frequency. Further, a selection means is provided for either connecting an output of the pulse shaping channel or the second measuring resonator to the processing means.

This measure has the advantage that the spectrometer may be easily operated in alternate modes for carrying out experiments at higher microwave frequencies (e.g. W-band) on the one hand or at lower microwave frequenies (e.g. X-band) on the other hand.

Moreover, it is preferred to provide means for switching-off the pulse shaping channel for enabling the spectrometer to perform continuous-wave experiments.

Further advantages may be taken from the description and the accompanying drawing.

It goes without saying that the afore-mentioned features and those features that will be explained here and below may not only be used in the respective mentioned combination but also in other combinations or alone without departing from the scope of the present invention.

BRIEF DESCRIPTION OF THE DRAWINGS

An embodiment of the invention is shown in the drawing and will be further described in the subsequent description.

DESCRIPTION OF THE PREFERRED EMBODIMENTS

Figure 1:
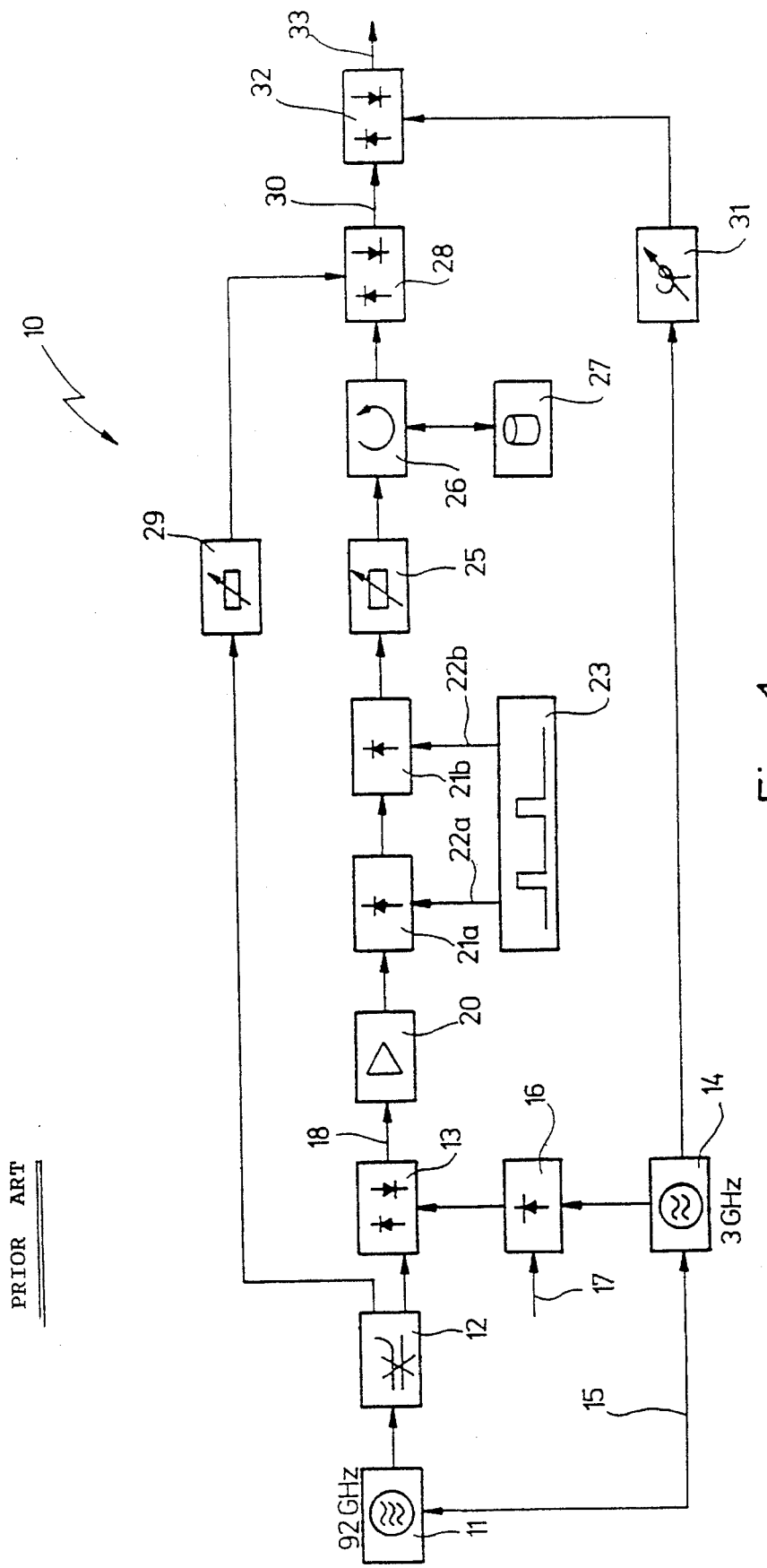
FIG. 1 shows a block diagram of a pulsed electron spin resonance spectrometer according to the prior art.

The block diagram shown in FIG. 1 corresponds to a prior art pulsed electron spin resonance spectrometer as described e.g. in the scientific literature of Allgeier and Weber mentioned at the outset of this specification.

The prior art spectrometer is designated by reference numeral 10 as a whole. However, FIG. 1 only shows the transmitter section and part of the receiver section whereas the remaining components as well as the magnet system have been omitted for the sake of clarity.

A first microwave oscillator 11 operates e.g. at a frequency of 92 GHz. The output signal of first microwave oscillator 11 is fed to a coupler 12 transmitting the substantial portion of the output signal on a first mixer 13. First mixer 13 has the signal of a second microwave oscillator 14 applied to its second input. Second microwave oscillator 14 operates at a substantially lower microwave frequency, for example at 3 GHz. Microwave oscillators 11 and 14 are synchronized with each other by means of a frequency lock as indicated by a double arrow 15.

An output 18 of first mixer 13, therefore, carries a mixed signal of 95 GHz as a sum signal, assuming that the difference signal of 89 GHz was filtered away.

The sum signal is now fed to an injection-lock-amplifier 20. Such amplifiers, due to their design concept, operate in a pulsed mode. Therefore, it is necessary to gate the output signal from second microwave oscillator 14 prior to feeding same to first mixer 13. For that purpose an amplitude modulator 16 having a control input 17 is provided for gating the signal from second microwave oscillator 14 with a gating time of 20 µs.

Behind injection lock amplifier 20 several switches being designed as PIN-diodes are arranged, of which only two are shown in FIG. 1 and designated as 21a and 21b. Via respective inputs 22a, 22b switches 21a, 21b are opened or closed, respectively, depending on a pulse shaping channel 23. The position of the pulses may not be freely selected because the pulse position must be adapted to the position of the gating signals.

The 95 GHz signal so amplified and pulsed is now fed to a circulator 26 via an adjustable attenuator 25. A measuring resonator 27 is coupled to a further input of circulator 26. The electron spin resonance signal may be taken from a third input of circulator 26, as known per se, and may be fed to a second mixer 28.

Second mixer 28 receives a reference signal from the coupled output of coupler 12 via an adjustable attenuator 29 which may, further, be provided with a phase shifter. Therefore, a signal having a frequency of, again, 3 GHz is present at an output 30 of second mixer 28. This signal is fed to a third mixer 32 having a reference input to which the output signal of second microwave oscillator 14 is applied which may be fed to third mixer 32 via a phase shifter 31 and, as the case may be, an attenuator. Therefore, a DC signal is present at an output 33 of third mixer 32. The DC signal may now be processed in the usual manner.

Figure 2:
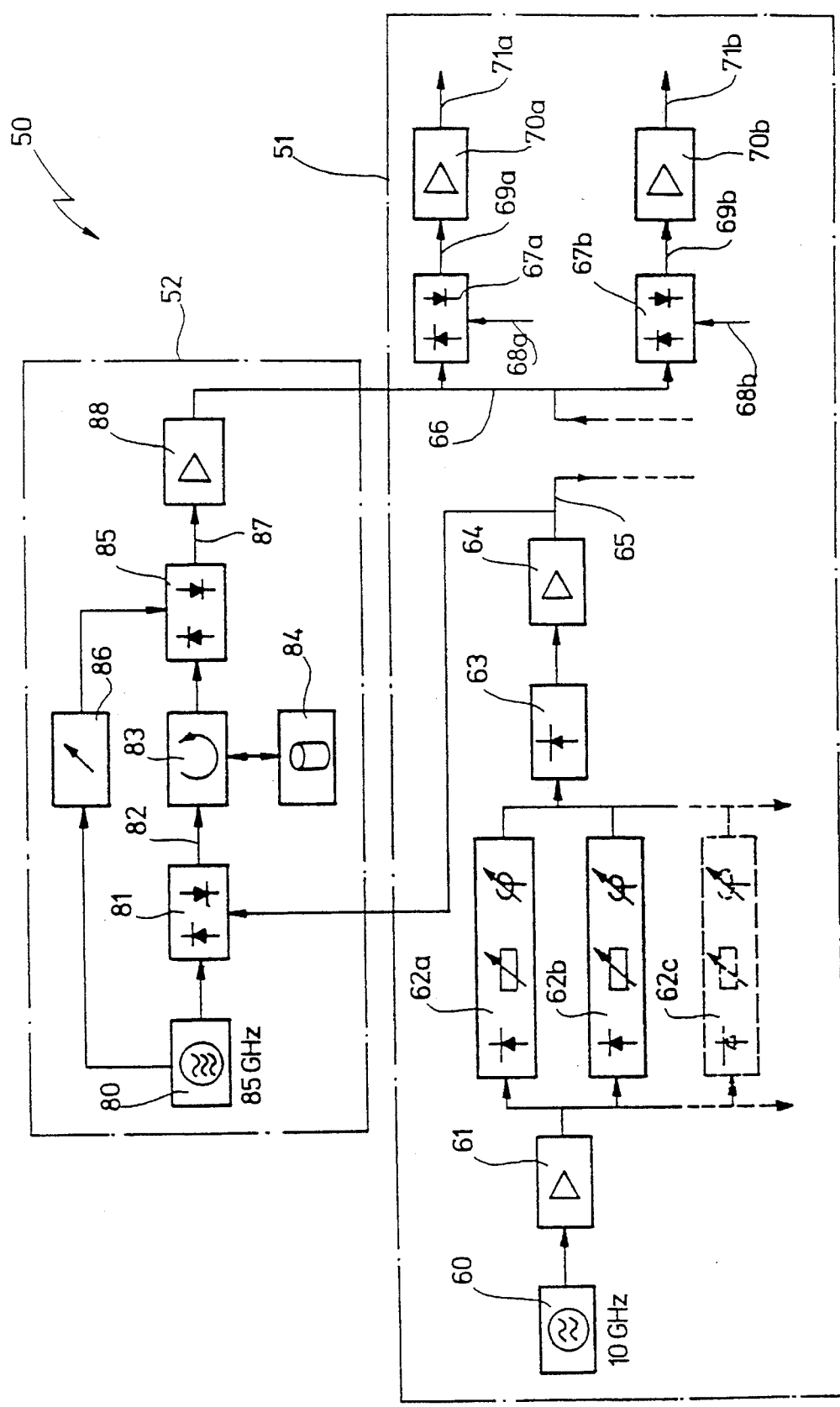
FIG. 2 shows a block diagram of a preferred embodiment of a pulsed electron spin resonance spectrometer according to the invention.

In contrast, FIG. 2 shows a block diagram of a preferred embodiment of a pulsed electron spin resonance spectrometer according to the present invention and being generally designated by reference numeral 50. In FIG. 2, too, parts of the receiving section, the magnet system etc. have been omitted for the sake of clarity.

Spectrometer 50 is subdivided into a low-frequency section 51 and a separate high-frequency section 52. Low-frequency section 51 is of conventional design and corresponds to the spectrometer, as described in more detail in U.S. patent specification 4,812,763 (Schmalbein) already mentioned. The disclosure of this patent specification is incorporated herein by way of reference.

Lower-frequency section 51 comprises a first microwave oscillator 60 having an operating frequency of, for example, 10 GHz, i.e. at X-band. First microwave oscillator 60 operates on an amplifier 61. Several pulse shaping channels are connected to the output of amplifier 61, only three of which being shown in FIG. 2 and being designated as 62a, 62b and 62c. Pulse shaping channels 62a through 62c each comprise means for switching, for adjusting amplitude and for adjusting phase. In this way any conceivable pulse sequence may be generated. In particular, one can generate pulses of any phase in any sequence. As the pulse generation is effected in parallel branches on the intermediate frequency, there are no enforced gaps between pulses of different phase and amplitude.

The outputs of pulse shaping channels 62a through 62c are provided with a common amplitude control unit 63, for example designed as a microwave diode. The amplitude control unit output, again, is connected to an amplifier 64 having an output 65 being connected with an X-band measuring resonator if conventional measurements shall be carried out as indicated in FIG. 2 with a dashed line. A second dashed line shall indicate that during the operation with a conventional X-band resonator the resonator output signal is transmitted to an input 66 of a further signal processing unit, also operating at 10 GHz. Such signal processing, in the depicted embodiment, comprises two mixers 67a, 67b switched in parallel, and having inputs 68a, 68b being subjected with a signal from first microwave oscillator 60. A DC signal is present at outputs 69a, 69b thereof, the DC signal being further processed via amplifiers 70a, 70b to outputs 71a, 71b.

Spectrometer 50 may alternately be operated in a pulsed mode and in a continous wave mode (CW). During CW operation one normally uses a modulation of the constant magnetic field being in the kHz-range in order to enable further phase selective processing of the measuring signal by means of a lock-in-amplifier. In this mode of operation the modulation signal will appear at input 66 of the signal processing unit.

In order to be able to use spectrometer 50 with a conventional lower frequency section 51 also for measurements at high microwave frequencies, the conventional X-band measuring resonator has to be removed. A selection means 90 (e.g., any conventional selector switching apparatus) may be used for selectively coupling the output 65 and the X Band measuring resonator 92 to the signal processing apparatus (i.e. mixers 67a, 67b, and amplifiers 70a, 70b). Output 65 as well as input 66 have to be connected to high-frequency section 52, as will be discussed hereafter:

High-frequency section 52 comprises a second microwave oscillator 80 having an operating frequency of e.g. about 85 GHz. The output signal of second microwave oscillator 80 is then fed to a second mixer 81, having a reference input being connected to output 65. As a 10 GHz signal is present at output 65, the sum frequency at output 82 of second mixer 81 is 95 GHz. The difference frequency of 75 GHz is much more remote in frequency, as compared with the prior art of FIG. 1 and is, therefore, automatically filtered away because the microwave components in this frequency range have a bandwidth of substantially less than 20 GHz.

Output 82 of second mixer 81 is connected to a circulator 83 having a further input being connected to a measuring resonator 84 and having a third input being connected to a third mixer 85. Third mixer 85 has a reference input being subjected with a signal from second microwave oscillator 80. A reference control unit 86 cares for proper adjustment of phase and/or amplitude. Output 87 of third mixer 85, therefore, again carries a 10 GHz signal. The 10 GHz signal is amplified in an amplifier 88 and is then fed to input 66 of low frequency section 51.

The operation of spectrometer 50 is as follows:

Within low-frequency section 51 elements 60 through 64 generate a pulsed microwave frequency having a frequency of 10 GHz. The microwave pulses are adjusted in amplitude, duration and pulse position in a conventional manner so that pulsed electron spin resonance experiments may be carried out. This pulsed 10 GHz signal is mixed in second mixer 81 with the output signal from second microwave oscillator 80 having a frequency of 85 GHz so that the pulses having been generated conventionally, are mixed up to the intended high microwave frequency. The pulsed experiment may now be carried out in measuring resonator 84 at the high microwave frequency. The output signal of measuring resonator 84 is then again mixed down to 10 GHz and may be processed by the elements being present in low-frequency section 51.

As one might take from the above, the components of low-frequency section 51 need not be changed since the signal from output 65 may without the necessity of further measures be processed within high-frequency section 52 and the measuring signal at input 66 is of the same kind as a measuring signal as would be generated during conventional mode of operation at X-band frequencies.

The spectrometer 50 according to the present invention may, therefore, use conventional X-band components within its pulse generating components (pulse shaping channels 62a through 62c). Moreover, spectrometer 50 may easily be converted with only a few operations from X-band-operation to, for example, W-band-operation. Finally, all pulse programs which already exist may be used for generating pulses and for processing signals without any modifications.

If, alternately, the Cw mode of operation is intended, one simply needs to omit the application of signals from low-frequency section 51 to second mixer 81. The sample will then be subjected to a continous wave signal from second microwave oscillator 80.

We claim:

1. A method of measuring pulsed electron spin resonance signals, the method comprising the steps of:

generating a first signal of a high microwave frequency of between 20 GHz and 250 GHz;

generating a second signal of a low microwave frequency of between 1 GHz and 20 GHz;

gating said second signal for obtaining a pulsed second signal;

mixing said first signal with said pulsed second signal for generating a pulsed mixed signal having a pulse length sufficient for carrying out pulsed electron spin resonance experiments;

applying said pulsed mixed signal to a measuring resonator containing a sample under investigation;

receiving a measuring signal from said resonator as a response to said application of said pulsed mixed signal;

mixing said measuring signal with an auxiliary signal derived from said first signal for generating an output signal having a lower microwave frequency; and processing said output signal.

2. The method of claim 1, wherein during said step of gating, said second signal is adjusted in its phase and amplitude.

3. The method of claim 1, wherein during said step of mixing said measuring signal, said measuring signal is mixed with said first signal itself.

4. The method of claim 1, wherein said first signal has a frequency of between 80 GHz and 250 GHz.

5. The method of claim 4, wherein said first signal has a frequency of between 80 GHz and 150 GHz.

6. The method of claim 1, wherein said second signal has a frequency of between 1 GHz and 13 GHz.

7. The method of claim 6, wherein said second signal has a frequency of between 9 GHz and 13 GHz.

8. A pulsed electron spin resonance spectrometer, comprising:

first means for generating a first signal of a high microwave frequency of between 20 GHz and 250 GHz;

second means for generating a second signal of a low microwave frequency of between 1 GHz and 20 GHz;

third means for gating said second signal for obtaining a pulsed second signal;

fourth means for mixing said first signal with said pulsed second signal for generating a pulsed mixed signal having a pulse length sufficient for carrying out pulsed electron spin resonance experiments;

fifth means for applying said pulsed mixed signal to a measuring resonator containing a sample under investigation;

sixth means for receiving a measuring signal from said resonator as a response to said application of said pulsed mixed signal;

seventh means for mixing said measuring signal with an auxiliary signal derived from said first signal for generating an output signal having a lower microwave frequency; and eigth means for processing said output signal.

9. The spectrometer of claim 8, wherein said first means comprises a first microwave oscillator.

10. The spectrometer of claim 8, wherein said second means comprises a second microwave oscillator.

11. The spectrometer of claim 8, wherein said third means comprises a pulse shaping channel.

12. The spectrometer of claim 11, wherein said pulse shaping channel comprises means for adjusting phase and amplitude of said pulsed mixed signal.

13. The spectrometer of claim 8, wherein said fourth means comprises a first mixer.

14. The spectrometer of claim 8, wherein said fifth means comprises a measuring resonator.

15. The spectrometer of claim 8, wherein said seventh means comprises a second mixer.

16. The spectrometer of claim 15, wherein said second mixer is provided with said first signal itself.

17. The spectrometer of claim 8, wherein said third means comprises a pulse shaping channel, said spectrometer, further, comprising:

processing means for processing said output signal;

a second measuring resonator operating at said low microwave frequency; and selection means for either connecting an output of said pulse shaping channel or said second microwave resonator to said processing means.

18. The spectrometer of claim 8, wherein said third means comprises a pulse shaping channel and means are provided for switching-off said pulse shaping channel for enabling said spectrometer to perform continuous-wave experiments.

* * * * *